United States Patent
Udo et al.

(10) Patent No.: US 6,897,403 B2
(45) Date of Patent: May 24, 2005

(54) PLASMA PROCESSING METHOD AND PLASMA PROCESSING APPARATUS

(75) Inventors: Ryujiro Udo, Ushiku (JP); Masatsugu Arai, Chiyoda (JP); Motohiko Yoshigai, Hikari (JP); Masanori Kadotani, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 10/378,601

(22) Filed: Mar. 5, 2003

(65) Prior Publication Data

US 2004/0173581 A1 Sep. 9, 2004

(51) Int. Cl.[7] .............................................. B23K 9/00
(52) U.S. Cl. ............................. 219/121.5; 219/121.55; 219/390; 219/405; 219/411; 392/416; 392/418; 118/724; 118/725; 118/50.1
(58) Field of Search .................................. 219/390, 405, 219/411, 121.55, 121.51; 392/416, 418; 118/724, 725, 50.1, 728

(56) References Cited

FOREIGN PATENT DOCUMENTS

JP          1-251735        * 10/1989

* cited by examiner

*Primary Examiner*—Shawntina Fuqua
(74) *Attorney, Agent, or Firm*—Antonelli, Terry, Stout & Kraus, LLP

(57) ABSTRACT

A plasma processing apparatus capable of processing the surface of a workpiece more precisely is provided. The plasma processing apparatus for supplying a gas between a sample and a sample table to generate plasma for processing the sample, comprises an adjusting device for changing a pressure supplied to a central side of the sample and a pressure of the gas supplied to an outer peripheral side as processing of the sample progresses.

3 Claims, 7 Drawing Sheets

PLASMA PROCESSING METHOD AND PLASMA PROCESSING APPARATUS

BACKGROUND OF THE INVENTION

The present invention relates to a plasma processing apparatus in which a sample, that is placed on a sample table arranged within a vessel, is processed using a plasma.

With a recent trend toward higher integration of semiconductor circuits, there has been a demand for the pattern of a circuit to have a finer configuration, and the demand for increased accuracy in the processing dimensions of a semiconductor has been severe. Further, an enhancement of the throughput and the realization of more uniform processing with respect to a larger area of a sample serving as a workpiece, such as a silicon wafer, have been requested as well. Therefore, in a plasma processing apparatus for processing a sample to produce a semiconductor device using plasma, the temperature controllability of a sample serving as a workpiece during the processing is important the following for the following reasons.

For example, in an etching process for formation of a groove having a high aspect ratio, an etching of high anisotropy is employed. In order to realize this, a process has been employed for carrying out etching of a groove bottom, while protecting the sidewalls of the groove by sue of a reactant product, such as an organic material. However, in an apparatus for supplying a processing gas into a vessel, the inside atmosphere of which is at a reduced pressure, the concentration of the reactant product brings forth a distribution under the influence of a characteristic of the exhaust (gas) flow within the vessel during the processing of a sample. Specifically, the reactant product is higher in concentration on the inner peripheral side of a wafer than on the outer peripheral side thereof.

The diameter of a holding surface in an electrostatic chuck on which a wafer is placed within the etching apparatus is sometimes smaller than the wafer itself, for the purpose of protecting the adsorption surface of the electrostatic chuck from the effects of the plasma. In such a case, in the surface near the outer peripheral end of the wafer, the size of a coarse for transmitting heat entering from the plasma, such as an area of the surface or an area of a portion in contact with other members, is small. Therefore, the outer peripheral region of the wafer rises in temperature.

In such a case as described above, particularly, in processing whose processing temperature increases as the wafer temperature increases, a problem arises in that the etching rate of the outer peripheral portion of the wafer becomes higher than that of the inner peripheral portion thereof, so that the etching rate is greatly different within the surface of the wafer. As a technique for improving the distribution of the processing speed, as described, there has been contemplated the provision of means for positively elevating the temperature at a position on the inner peripheral side of the wafer relative to the temperature at a position on the outer peripheral side thereof.

For example, some means have been devised which control the distribution of the temperature within the surface of a workpiece, such as a silicon wafer, that has been chucked on an electrostatic chuck. Among them, Japanese Patent Laid-open No. 251735/1989 discloses a technique in which a gas is filled between an electrostatic chuck and a workpiece, and its pressure (hereinafter referred to as the back pressure or pressure of the back surface) is changed, whereby the heat transfer rate between the electrostatic chuck and the workpiece is changed to control the temperature distribution of the workpiece.

In order to control the temperature, the above-described technique utilizes properties in which the heat transfer rate increases as the pressure of the gas increases. To be more specific, the back pressure of a portion whose temperature should be lowered relatively within the surface of the workpiece, such as a silicon wafer, is made high; whereas, the backpressure of a portion whose temperature should be elevated relatively is made low, thereby causing the heat transfer rate from the workpiece to the electrostatic chuck to have a desired distribution. Thus, a desired temperature distribution in the in-surface direction is created with respect to the amount of heat entering from the plasma above the workpiece.

According to the prior technique, as described above, the temperature distribution of the workpiece, such as a silicon wafer, that is chucked on the electrostatic chuck, can be controlled relatively simply and efficiently in terms of time.

However, there is a problem in that, if a suitable temperature distribution is desirably obtained within the surface of the workpiece, using prior technique as described, it is difficult to control the temperature delicately. More specifically, in the above-described prior technique, where there is heat entering the workpiece, or, where there is a temperature difference between the workpiece and the sample table, including the electrostatic chuck supporting the workpiece, the temperature distribution can be obtained in the process substance. Where the amount of heat entering the workpiece is small, or the temperature difference relative to the sample table (electrostatic chuck) is small, it becomes difficult to form a sufficiently large distribution of temperature. In particular, where the temperature of the sample table or the electrostatic chuck is higher than that of the workpiece, this problem is noticeable. This point will be described in detail hereinafter.

FIG. 6(a) is a flowchart illustrating a flow of processing to be described later, and FIG. 6(b) is a graph showing the pressure distribution of a gap between a wafer and an electrostatic chuck, and a gap in the temperature distribution of the surface of a wafer with respect to time. This processing is performed such that, where the back pressure on the inner peripheral side of a workpiece is set to a relatively low value, whereas that on the outer peripheral side is set to relatively high value, in order to control the temperature on the inner peripheral side of the workpiece to be high while the temperature on the outer peripheral side is controlled to be low, in a state where the temperature of the electrostatic chuck in contact with the workpiece to support it is held at a temperature higher than room temperature. Prior to the start of the process, the electrostatic chuck is held at a desired fixed temperature, e.g., 60° C., which is higher than room temperature.

First, a workpiece, such as a semiconductor wafer, whose temperature in the in-surface direction is nearly room temperature and the distribution thereof is set to be generally uniform, is carried to and placed on a sample table provided with an electrostatic chuck. At that time, an electrostatic chucking voltage is applied to the electrostatic chuck substantially simultaneously with the placement of the workpiece. Where the electrostatic chuck is of a single pole type, in this state, plasma having a capacity of static electricity is not formed, and the adhesive force for chucking the workpiece is not created. Therefore, a gas for heat transmission is not introduced into the back of the wafer. A plasma is generated at time t=t0.

Next, heat transmitting helium is introduced between the back of the wafer and the surface of the electrostatic chuck. This helium is introduced to enhance and adjust the efficiency of heat transmission between the wafer and the electrostatic chuck. The pressure of the helium is controlled in such a manner as to be low on the inner peripheral side of the wafer and high on the outer peripheral side, as mentioned above. In such a case, the temperature of the workpiece is normally lower than that of the electrostatic chuck, and the heat transfer rate between the workpiece and the electrostatic chuck is larger on the outer peripheral side than the inner peripheral side; and, therefore, the temperature on the outer peripheral side of the workpiece becomes relatively higher than that on the inner peripheral side with the lapse of time. That is, a temperature distribution that is opposite to the desired temperature distribution is obtained. After the further lapse of time, heat on the outer peripheral side of the wafer is transmitted to the electrostatic chuck more efficiently, and, therefore, the temperature on the outer peripheral side of the wafer gradually becomes lower than the temperature on the inner peripheral side. In this manner, when the time is t=t2, the temperature distributions on the inner and outer peripheral sides are reversed so as to obtained the desired temperature distribution.

As described above, in the prior technique, finally, the desired temperature distribution on the wafer, in which the inside is high and the outside is low, is obtained, but in the actual process, an inconvenience often occurs. In the aforementioned process, because etching is carried out in the period from t0 to t2 with a temperature distribution that is opposite to the desired temperature distribution, and in the process that is adjusted so as to exhibit a predetermined performance of the processing speed or the like where the wafer is provided with the desired temperature distribution, the temperature distributions of the inner and outer peripheral sides of the workpiece are reversed in the midst of the process, and, therefore, for the period of time from time immediately after the processing has been started to t2, a desired processing result is not obtained. Further, where the process is adjusted so as to obtain more suitable processing immediately after starting the process, the result of processing performed thereafter is deteriorated from the initial stage. As described above, adjustment of the process for processing the workpiece to obtain a desired result, for example, construction of a recipe is difficult to impair the performance of processing of a semiconductor for carrying out fine working, which poses a problem in that the yield of the process is lowered. This fact has not been taken into consideration in the prior art.

It is an object of the present invention to provide a plasma processing apparatus that is capable of processing the surface of a workpiece more precisely.

SUMMARY OF THE INVENTION

The above-described problems are solved by a plasma processing apparatus in which a gas is supplied between a sample and a sample table to generate a plasma for processing the sample. This apparatus comprises an adjusting device for changing the pressure of the gas supplied to a central portion of the sample and the pressure of the gas supplied to an outer peripheral portion thereof as processing of the sample progresses.

Further, the above-described problems are solved by a plasma processing apparatus in which a gas is supplied between a sample and a sample table to generate plasma for processing the sample. This apparatus comprises an adjusting device for adjusting the pressure of the gas supplied to a central portion of the sample to a high-level at the first stage of the processing and to a low-level later in the processing.

Further, the above-described problems are solved by a plasma processing apparatus in which a gas is supplied between a sample and a sample table to generate plasma for processing the sample. This apparatus comprises an adjusting device for adjusting the pressure of the gas supplied to an outer peripheral side of the sample to a low-level at the first stage of the processing and to a high-level later in the processing.

Further, the above-described problems are solved by a plasma processing apparatus for processing a sample, that is placed on a sample table, using a plasma, wherein the heat transfer between the sample and the sample table is changed as the processing of the sample progresses.

Further, the above-described problems are solved by a plasma processing apparatus for processing a wafer, that is placed on a table, using a plasma, wherein the heat transfer between an outer peripheral portion of the wafer and the surface of the table and the heat transfer between the central portion of the wafer and the surface of the table are changed as the processing progresses.

Further, the above-described problems are solved by a plasma processing apparatus for processing a wafer, that is placed on a table, using plasma, wherein, during a period in which the wafer is placed on the table, prior to the plasma being formed, the heat transfer between an outer peripheral portion of the wafer and the surface of the table is made smaller than the heat transfer between the central portion of the wafer and the surface of the table; and, after the plasma has been formed, the heat transfer between the outer peripheral portion of the wafer and the surface of the table is made larger than the heat transfer between the central portion of the wafer and the surface of the table.

BRIEF DESCRIPTION OF THE DRAWINGS

Other objects and advantages of the invention will become apparent from the following description of various embodiments, with reference to the accompanying drawings, in which.

DETAILED DESCRIPTION OF THE PREFERRED EMBODIMENTS

Embodiment 1

One of the preferred embodiments of the present invention will below be described with reference to FIGS. 1 to 3(b) of the accompanying drawings.

Figure 1:
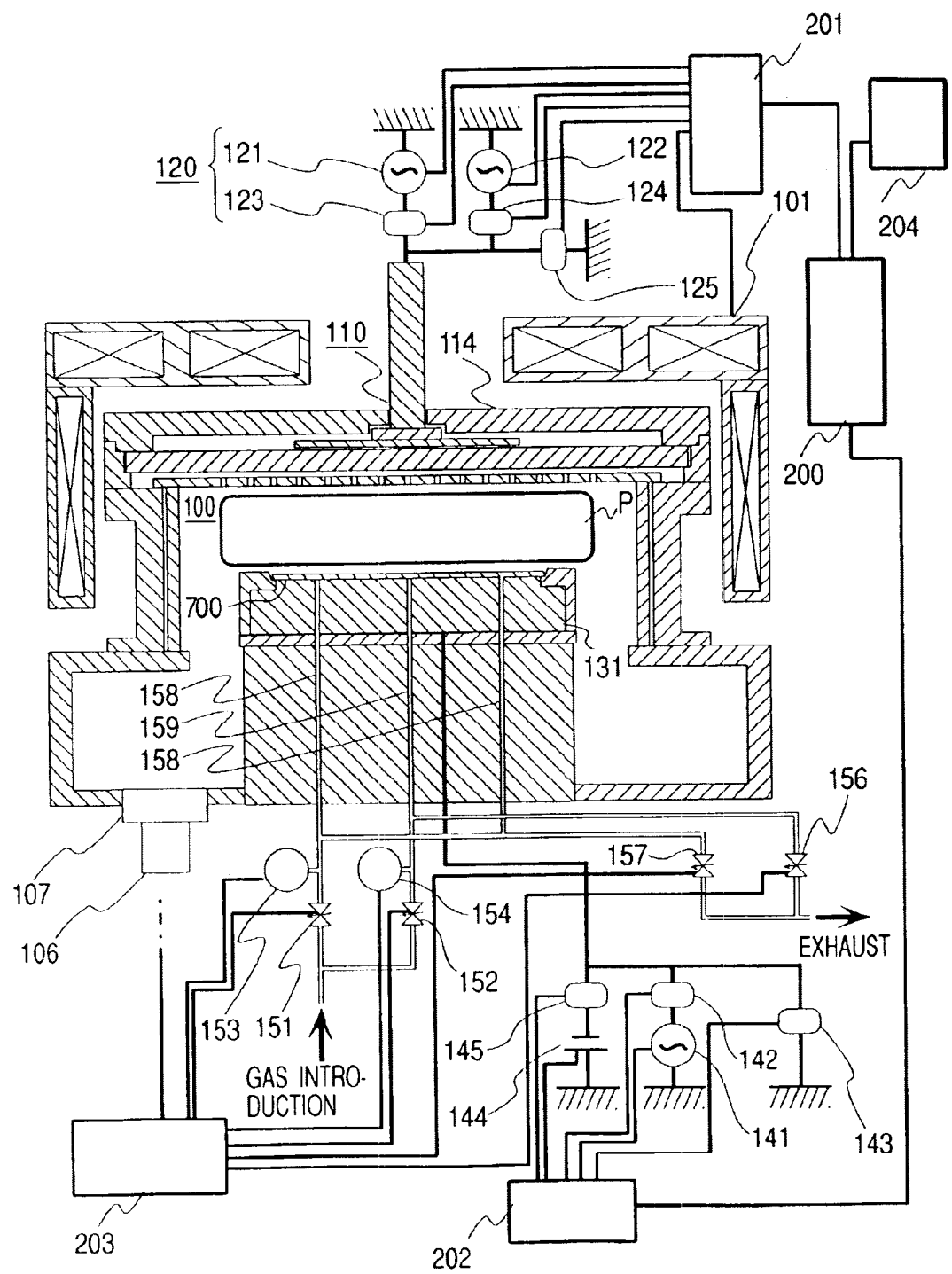
FIG. 1 is a sectional view of a plasma etching apparatus according to a first embodiment of the present invention.
Figure 2A:
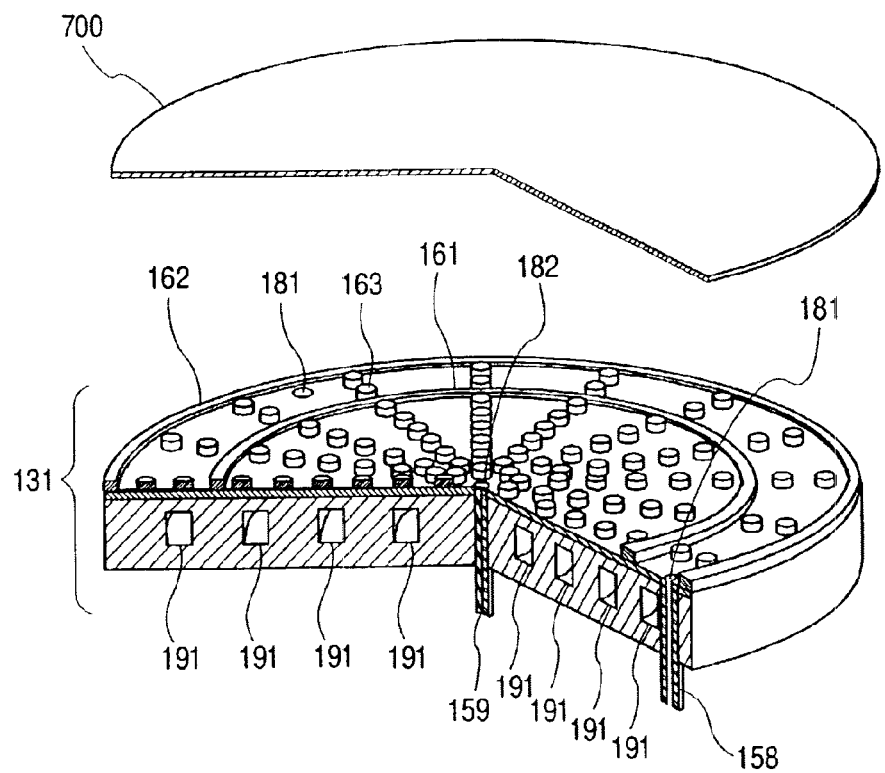
FIG. 2(a) is a perspective view, partly in section, of an electrostatic chuck according to the first embodiment of the present invention.
Figure 2B:
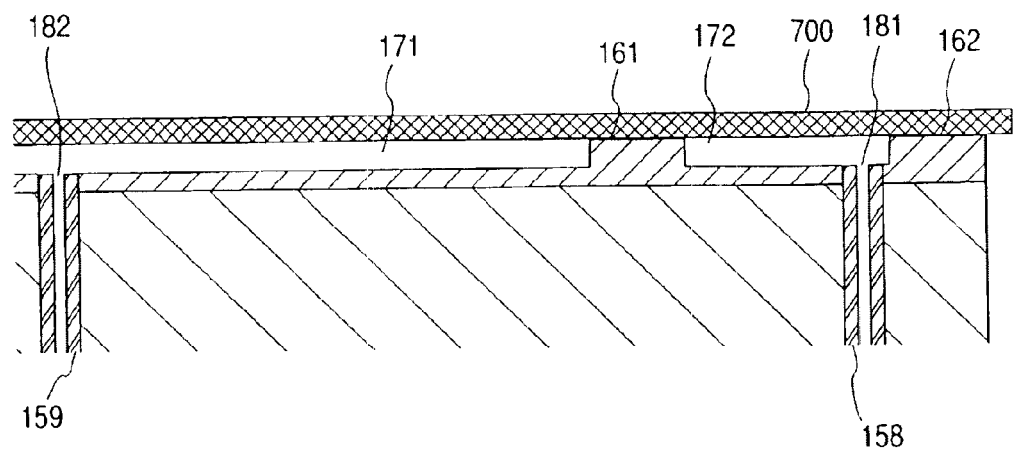
FIG. 2(b) is a side sectional view of the electrostatic chuck of FIG. 2(a)

FIG. 1 is a sectional view of a plasma processing apparatus according to the first embodiment of the present invention. FIG. 2(a) is a perspective view of an electrostatic chuck that is capable of realizing the present invention, and FIG. 2(b) is a sectional view of the electrostatic chuck.

Referring to FIG. 1, a vacuum reactor 100 defines a reaction space internally of a vacuum vessel that is capable of achieving a vacuum of about $1/10000$ Pa. Above the vacuum reactor 100, there is provided an antenna 110 for emitting an electromagnetic wave, and an electrostatic chuck 131 is provided in the reaction space for supporting a workpiece 700, such as a wafer. The antenna 110 and the electrostatic chuck 131 are disposed in parallel and arranged opposite to each other. Magnetic field forming means 101, which is formed, for example, of electromagnetic coils and yokes, is disposed around the circumference of the vacuum reactor 100. A processing gas which is introduced into the vacuum reactor, is formed into a plasma P by the interaction of an electromagnetic wave emitted from the antenna 110 and a magnetic field formed by the magnetic field forming means 101, so as to process the workpiece 700.

On the other hand, the vacuum reactor 100 is vacuum-evacuated by a vacuum evacuation system 106, and the pressure is controlled by pressure control means 107. The processing pressure is controlled in a range from 0.1 Pa to 10 Pa. The antenna 110 is held in a housing 114, which serves as part of the vacuum vessel. A processing gas for carrying out processes, such as the etching of a workpiece and film forming, is supplied with a predetermined flow rate; and, the mixing ratio of the gas provided from gas supply means (not shown) is controlled in accordance with a predetermined distribution, and the gas then is supplied to the vacuum reactor 100.

An antenna power supply 121 and an antenna bias power supply 122, which together serve as an antenna power supply 120, are connected to the antenna 110 through a matching circuit and filters 123 and 124, respectively, and they are connected to ground through a filter 125. The antenna power supply 121 supplies electric power in the UHF frequency band from 300 MHz to 1 GHz. In the present embodiment, the frequency of the antenna power supply 121 is 450 MHz. On the other hand, the antenna bias power supply 122 applies bias electric power at a frequency in a range from scores of kHz to scores of MHz to the antenna 110. In the present embodiment, the frequency is 13.56 MHz.

The electrostatic chuck 131 is provided in the lower portion of the vacuum reactor 100, and it is arranged opposite to the antenna 110. A bias power supply 141 for supplying bias electric power, for example, in a range from 200 kHz to 13.56 MHz, is connected to the electrostatic chuck 131 through a matching circuit/filter system 142 to control the bias applied to the workpiece 700, and it is connected to ground through a filter 143. In the present embodiment, the frequency of the bias power supply is 400 kHz.

The workpiece 700, such as a wafer, is placed and held on the upper surface of the electrostatic chuck 131, that is, on the surface on which the workpiece is to be held, as mentioned above. When etching is applied to the wafer 700 using the plasma etching apparatus of the present embodiment, a DC voltage of several 100 V to several kV is applied from a DC power supply 144 for electrostatic adsorption, via a filter 145, to generate the required chucking force. Further, the surface of the electrostatic chuck 131 is controlled to a predetermined temperature by temperature control means (not shown). Heat transmitting gases of a plurality of systems, e.g., helium gas, are supplied to a gap between the surface of the electrostatic chuck 131 and the back of the wafer 700 from pipes 158 and 159, through flow-rate control devices 151 and 152. The pressures of the heat transmitting gases are measured by pressure gauges 153 and 154. The heat transmitting gases also can be exhausted through the flow-rate control devices 156 and 157. By using this system, the heat transfer rate between the workpiece 700 and the transmitting gases can be controlled precisely in a plurality of independent systems.

The plasma processing apparatus according to the present embodiment is provided with a main control device 200 for controlling the operation of the apparatus. The main control device 200 is connected to the antenna power supply 121, the antenna bias power supply 122, the matching circuit/filters 123, 124 and the magnetic field forming means 101, and it is connected to a first control device 201 for delivering and receiving a signal indicative of the states of these devices, or a signal of instructions for operation thereof. Likewise, the main control device 200 is connected to a second control device 202, which is connected to the bias power supply 141, the electrostatic chucking power supply 144 and the filter 143 to deliver and receive a signal indicative of the states of these devices and a signal of instructions for operation thereof. In addition, the main control device 200 is connected to a third control device 203, which is connected to the helium gas flow-rate control devices 151, 152, and to the pressure gauges 153, 154 to deliver and receive signals indicative of instructions or the states of these operations. The main control device 200 receives signals from the first, second and third control devices 201, 202 and 203, and it delivers signals, including instructions for adjusting operations of parts connected thereto, to control the operation of the apparatus.

Further, the main control device 200 is connected to a display/instruction means 204 that is capable of showing the state or setting of the plasma processing apparatus to a user and is capable of inputting instructions by which the user causes the apparatus to carry out a desired operation. The instructions for operation input from the display/instruction means 204 are transmitted to the main control device 200 to operate the first, second and third control means 201, 202 and 203, so that the operation of the present apparatus is controlled as desired. Examples of the display/instruction means 204, as described above, include means provided with a monitor for displaying information, such as a state or error of operation of the apparatus, or an operating panel for carrying out inputting of setting values or instructions.

The plasma etching apparatus according to the present embodiment is configured as described above. A specific process, in a case where etching of silicon, for example, is carried out using this plasma etching apparatus, will be described below.

In FIG. 1, first, the wafer 700 to be processed is transported into the vacuum reactor 100 by a workpiece carrying mechanism (not shown), after which it is placed and chucked on the electrostatic chuck 131, and the height of the electrostatic chuck 131 is adjusted, as necessary, and set to a predetermined gap. Then, gases necessary for the etching of the workpiece 700, for example, chlorine and hydrogen bromide, are supplied from the gas supply means (not shown) into the vacuum reactor 100 with a fixed flow-rate and a desired mixing ratio. At the same time, the vacuum reactor 100 is adjusted to a predetermined processing pressure by the vacuum evacuating system 106 and the pressure control means 107.

Successively, an electromagnetic wave is emitted from the antenna 110 in response to an electric power of 450 MHz that is supplied from the antenna power supply 121. The plasma P is created within the vacuum reactor 100 by the interaction of a generally horizontal magnetic field of 160 Gauss (electrocyclotron resonance magnetic field strength with respect to 450 MHz), that is formed inside the vacuum reactor 100 by the magnetic field forming means 101, with the processing gas, which is dissociated thereby so as to generate ions or radicals. Further, a composition ratio of ions or radicals in the plasma or energy is controlled by the antenna electric power received from the antenna bias power supply 122 or bias electric power received from the bias power supply 141 of a lower electrode, so as to carry out the etching process for the wafer 700. Upon completion of the etching process, the supply of electric power/magnetic field and processing gas is stopped, and the etching is completed.

Next, one example of the electrostatic chuck used in the present embodiment will be described with reference to FIGS. 2(a) and 2(b).

In FIG. 2(a), the electrostatic chuck 131 is formed on its upper surface with concentric ring-like convex portions 161 and 162. When the wafer 700 is chucked on the upper surface of the electrostatic chuck 131, the upper surfaces of the ring-like convex portions 161 and 162 come in close contact with the back of the wafer 700 to form independent gaps 171 and 172, as shown in FIG. 2(b). Independent heat transmitting gases, with respective predetermined pressures, are supplied from gas supply holes 181 and 182 to the gaps 172 and 171, respectively. The pressure of the heat transmitting gas, i.e., the back pressure, is controlled to thereby control the temperature of the wafer 700.

Further, in FIG. 2(a), the electrostatic chuck 131 is formed in its upper surface with individual convex portions 163. These convex portions 163 are formed so that the upper portion thereof comes in contact with the back of the wafer 700, to thereby generate an adsorption force. Accordingly, all the surfaces of the ring-like convex portions 161, 162 and convex portions 163 for adsorption are substantially flush with one another. It is noted that for the sake of convenience of illustration, the height of these convex portions is depicted to be equal to the thickness of the wafer 700, but in an actual electrostatic chuck, the height of the convex portions is very much less than the thickness of the wafer 700.

The area of contact between the electrostatic chuck 131 and the wafer 700 is smaller than the total area of the upper surface of the electrostatic chuck 131 for the purpose of reducing the quantity of foreign matter that adheres to the back of the wafer, while making the back pressure (pressure on the back surface of the wafer) even. However, since the wafer adsorption force is generally proportional to the substantial contact area between the electrostatic chuck and the wafer, it is necessary to adequately select the size of the contact area. Further, the reason why the ring-like convex portions 161 and 163 are provided is to partially control the back pressure, which will be described in more detail later.

Further, in the present embodiment, the plane shape of the convex portions 163 for adsorption is circular, but their shape may be any plane shape, if the adsorption force is secured. For example, the upper surface of the electrostatic chuck 131 may be formed as a surface which has a predetermined surface roughness in micro, but which is to be a single plane in macro, and only the portion corresponding to the ring-like convex portions is given a small surface roughness. Even by this construction, the object of the present invention can be achieved.

In addition, the electrostatic chuck 131 is internally formed with flow-passages 191. A fluid having a predetermined temperature is injected into the flow-passages 191 for circulation, whereby the whole electrostatic chuck 131 can be controlled to a nearly constant temperature, as desired.

Figure 3A:
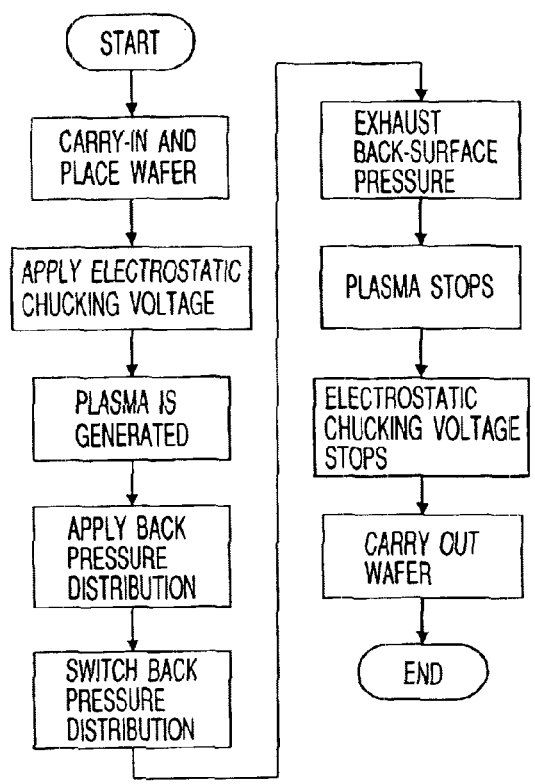
FIG. 3(a) is a flowchart illustrating the plasma etching process of the first embodiment.
Figure 3B:
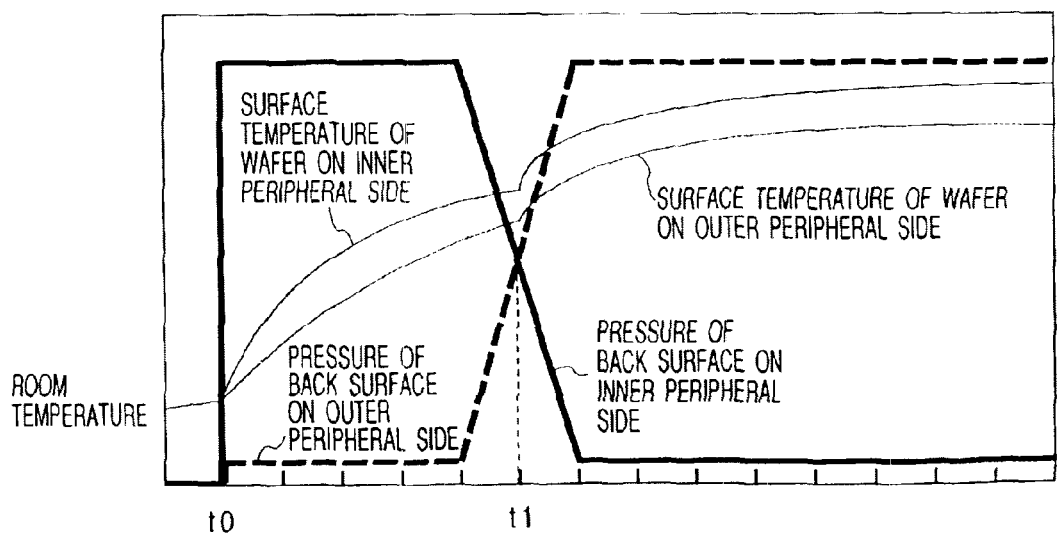
FIG. 3(b) is a graph showing the pressure distribution in a gap between a wafer and an electrostatic chuck, and the change in the temperature distribution of the wafer surface with respect to time, according to the first embodiment.

Next, the process used for plasma etching of the surface of the wafer 700 will be described with reference to FIGS. 1, 2(a), 2(b), 3(a) and 3(b). FIG. 3(a) is a flowchart showing the flow of operations in the present embodiment, and FIG. 3(b) is a graph showing the pressure distribution of the gap between the wafer 700 and the electrostatic chuck 131, as well as the change in the temperature distribution of the surface of the wafer 700 with respect to time. Prior to the start of the processing, the electrostatic chuck 131 shown in FIGS. 1, 2(a) and 2(b) is held at a desired predetermined temperature, for example, 60° C., which is much higher than room temperature.

First, the wafer 700, which is at room temperature and whose in-surface temperature is generally uniform, is carried to and placed on the electrostatic chuck 131, using a wafer transport system (not shown), and, nearly simultaneously, an electrostatic chucking voltage is applied to the electrostatic chuck. Where the electrostatic chuck is of the single pole type, in this state, a sufficient adsorption force is not generated, and, therefore, plasma is generated at time t=t? 0.

When the plasma is generated, since the plasma acts as an electrical conductor, the wafer 700 is chucked on the electrostatic chuck 131 by the adsorption force. Next, helium is introduced in the gap between the back of the wafer 7 and the surface of the electrostatic chuck 131. The helium is introduced in order to control the heat transfer between the wafer 700 and the electrostatic chuck 131. The adsorption surface of the electrostatic chuck 7 formed by the ring-type convex portions 161 and 162 thereon, as shown in FIGS. 2(a) and 2(b), and the upper surfaces of the convex portions 161 and 162, come in close contact with the back of the wafer to considerably suppress the passage of gases. Accordingly, it is possible to impart a difference in pressure between the areas inside and outside of the convex portion 161, particularly, between the gaps 171 and 172, as seen in FIG. 2(b).

In the present embodiment, it is desired that the wafer 700, which is at room temperature at first, is chucked on the electrostatic chuck 131, which has a higher temperature than room temperature, to make the temperature on the inner central region of the wafer 700 relatively high and the temperature in the outer peripheral region relatively low. Therefore, the heat transfer rate from the electrostatic chuck to the wafer on the inner central region side of the convex portion 161 is made larger than that on the outer peripheral side thereof. That is, the back pressure (pressure of the back surface of the wafer) on the inner central region side is made high, and the back pressure on the outer peripheral region side is made low. There are two examples of specific methods of imparting this pressure difference. One is a method which involves introducing, respectively, high and low pressure helium into the inner central region side and the outer peripheral region side of the wafer 7 and the electrostatic chuck 131; while, the other is a method which involves introducing helium into only the inner central region side, and evacuating the outer peripheral region side. By imparting such a difference in back pressure, the temperature on the inner central region side of the wafer 700, which has been at room temperature, becomes higher than that on the outer peripheral region side.

The difference in temperature between the inner and outer sides of the convex portion 161 is enlarged for a fixed time, but thereafter, it becomes smaller with the lapse of time. This is because of the fact that, mainly, heat entering from the plasma is generally uniform in the surface of the wafer, and, therefore, heat entering the inner central region side is transferred more quickly to the electrostatic chuck 131 than heat entering the outer peripheral region side. Accordingly, in order to maintain a high temperature on the inner central region side, it is necessary to make the heat transfer rate on the inner central region side smaller than that on the outer peripheral region side. Thus, the flow-rate adjusting devices 151, 152, 156 and 157 in FIG. 1 are operated to make the back pressure on the inner central region side small at time t=t1, and to make the back pressure on the outer peripheral region side large. The switching of the back pressure is a most important feature of the present invention. This makes it possible to hold the temperature distribution, in which the temperature on the inner central region side is higher than that on the outer peripheral region side, in the surface of the wafer 700.

If the etching is carried out under this condition, an etching rate can readily be obtained which is actually uniform from the center of the wafer to the vicinity of the outer peripheral edge thereof.

Embodiment 2

A second embodiment of the present invention will be described in detail hereinafter.

Figure 4A:
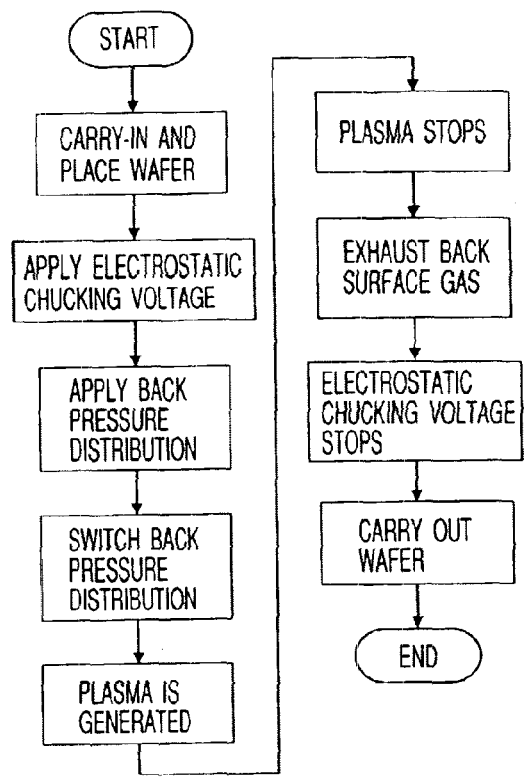
FIG. 4(a) is a flowchart illustrating a plasma etching process according to a second embodiment of the present invention.
Figure 4B:
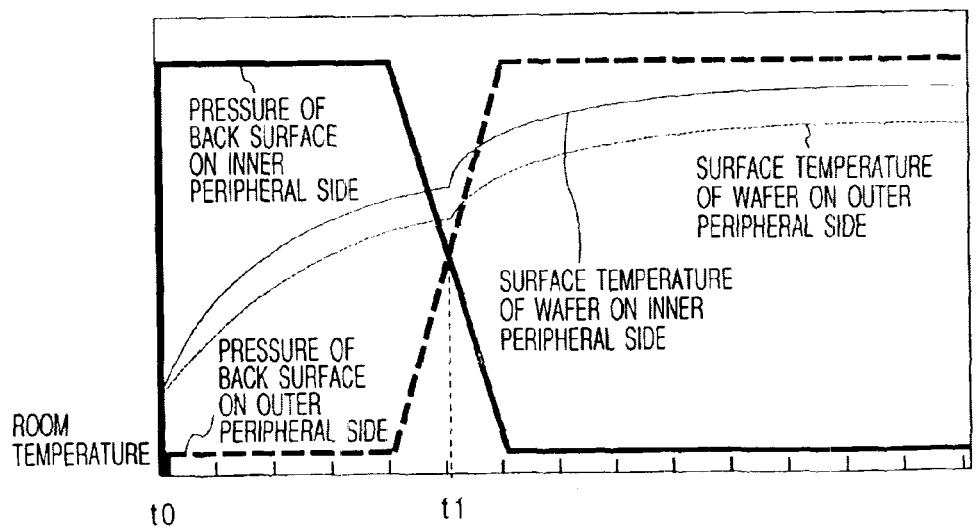
FIG. 4(b) is a graph showing the pressure distribution in a gap between a wafer and the electrostatic chuck, and an change in temperature distribution of the wafer surface with respect to time, according to the second embodiment.

In the first embodiment, since an electrostatic chuck of the single pole type is used, there is a deviation in time between the placement of the wafer and the introduction of helium into the gap at the back of the wafer. This is because of the fact that, unless an electrostatic chuck of the single pole type generates a plasma, a sufficient adsorption force is not generated. However, when an electrostatic chuck of the bi-pole type is used, placement of the wafer and introduction of helium into the gap at the back of the wafer can be carried out nearly simultaneously. In the following, the process for controlling the back pressure, i.e., the pressure of the heat transmitting gas, where an electrostatic chuck of the bi-pole type is used, will be described with reference to FIGS. 1, 2(a), 2(b), 4(a) and 4(b). FIG. 4(a) is a flowchart for illustrating the flow of operations in the present embodiment. FIG. 4(b) is a graph illustrating the pressure distribution in a gap between a wafer 700 and an electrostatic chuck 131, as well as the change in the temperature distribution of the surface of the wafer 700 with respect to time. Prior to the start of the processing, the electrostatic chuck 131 in FIGS. 1, 2(a) and 2(b) is held at a desired predetermined temperature, for example, 60° C., which is much higher than room temperature.

First, the wafer 700 is placed on the upper surface of the electrostatic chuck 131, and a voltage of hundreds of volts is applied from a power supply for the electrostatic chuck at time t=t? 0 to chuck the wafer 700. Nearly simultaneously therewith, helium of high pressure and helium of low pressure are introduced into the inner central region side and the outer peripheral region side, respectively, of the wafer 700 and the electrostatic chuck 131. Alternatively, helium may be introduced into the inner central portion side, while evacuating the outer peripheral region side. Thus, heat from the electrostatic chuck 131 is transmitted more quickly to the portion on the inner central region side of the wafer 700 than to the portion on the outer peripheral region side, so that the temperature on the inner peripheral region side becomes higher.

However, the difference in temperature between the inner and outer regions, which at first was large, becomes smaller with the lapse of time. The reason why is that the temperature on the inner central region side of the wafer 700 comes close to a saturated temperature, that is, the temperature of the electrostatic chuck, so that the rise of the temperature becomes moderate, whereas the rise of the temperature on the outer peripheral region side lasts. Accordingly, at time t=t1, assuming a predetermined temperature difference, the back pressures of the inner peripheral portion and outer peripheral portion are reversed, that is, the back pressure on the inner central region side is made small, and the back pressure on the outer peripheral region side is made large. The switching of the pressure is a most important feature of the present invention. Nearly simultaneously with this switching, a plasma is generated. Thus, the temperature on the inner central region side can be maintained high as compared with that of the outer peripheral region side for the same reason as that mentioned in the first embodiment. When etching is carried out under this condition, an etching rate can be obtained in which the uniformness is very high from the center of the wafer to the vicinity of the outer peripheral edge.

Since the temperature control method according to the present invention has a very high flexibility, application of this control method makes it possible to change the temperature during processing within a lot of wafers, or to finely adjust the temperature of a wafer during processing of the wafer.

Figure 5A:
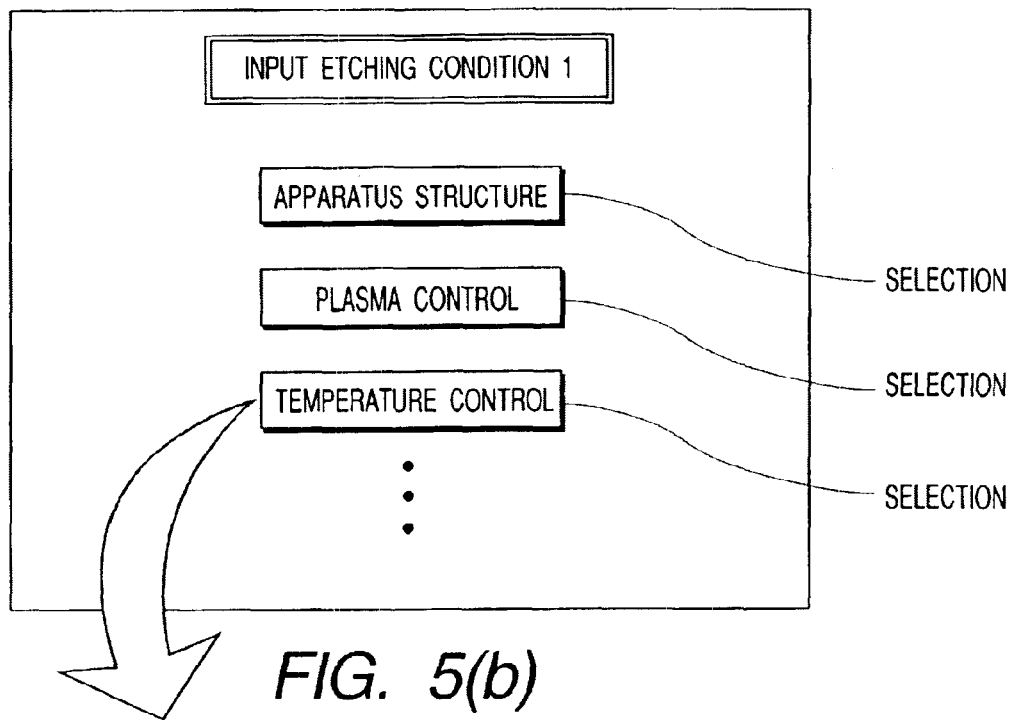
FIGS. 5(a) and 5(b) are schematic diagrams of a display screen showing examples of displays produced when a control system necessary for carrying out the present invention is set.
Figure 5B:
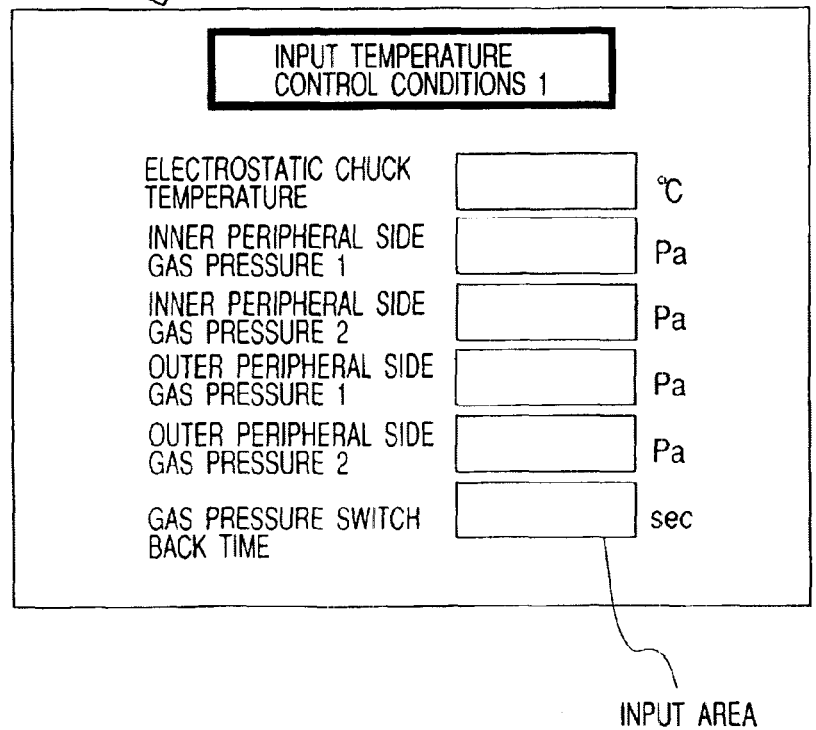
Figure 6A:
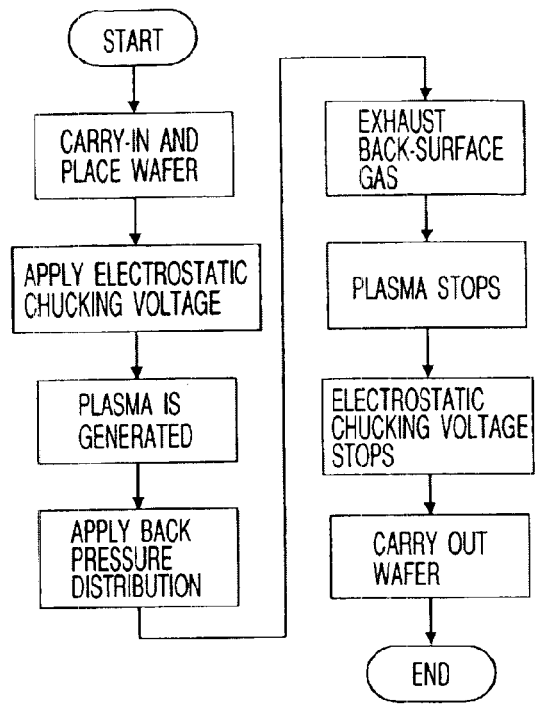
FIG. 6(a) is a flowchart illustrating a plasma etching process of the prior art.
Figure 6B:
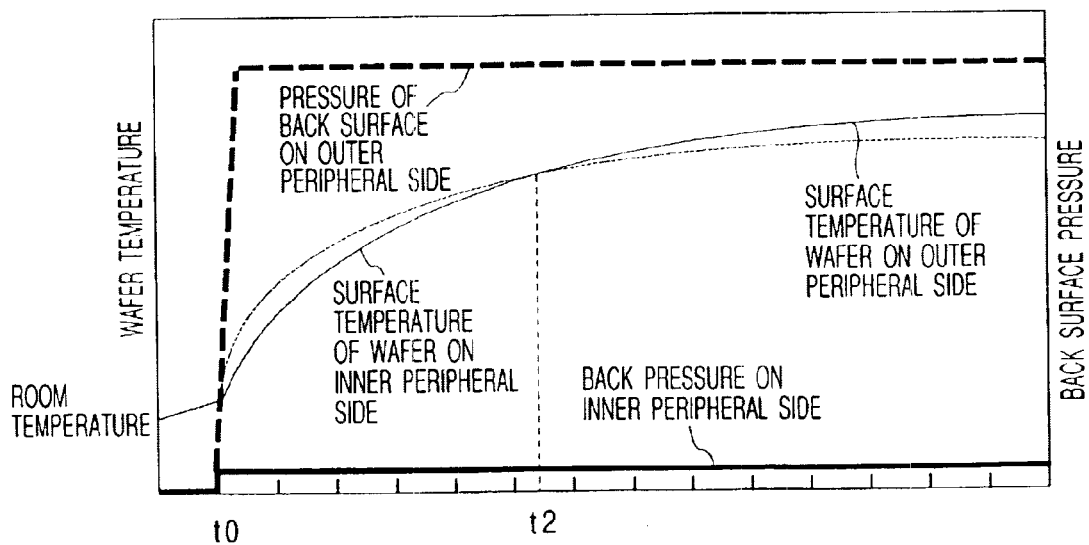
FIG. 6(b) is a graph showing the pressure distribution in a gap between a wafer and an electrostatic chuck, and the change in temperature distribution of the wafer surface with respect to time, according to the prior art process.

FIGS. 5(a) and 5(b) are diagrams schematically showing a screen displayed on a monitor provided on the display/instruction input device 204, when an operation for carrying out the aforementioned process is set. For example, when 'Temperature control' in FIG. 5(a) is selected, the screen of FIG. 5(b) is displayed on the monitor, and desired values can be entered in respective input areas. On the display screen of FIG. 5(b), there are not less than two places at which the respective gas pressures on the inner central region side and the outer peripheral region side can be entered, and a user is able to enter values to be set into these places by input means provided on the display/instruction input device. The input means may be a touch panel in which a user touches the display screen itself to operate the screen for entering commands, or input devices, including a keyboard or a mouse, connected to the display/instruction input device.

Embodiment 3

A third embodiment of the present invention will be described in detail hereinafter. The structure of the present embodiment is in accordance with the embodiment shown in FIG. 1; and, structures which are the same as those of the embodiment shown in FIG. 1 are identified by the same reference numerals, and a repeated description thereof is omitted.

Figure 7:
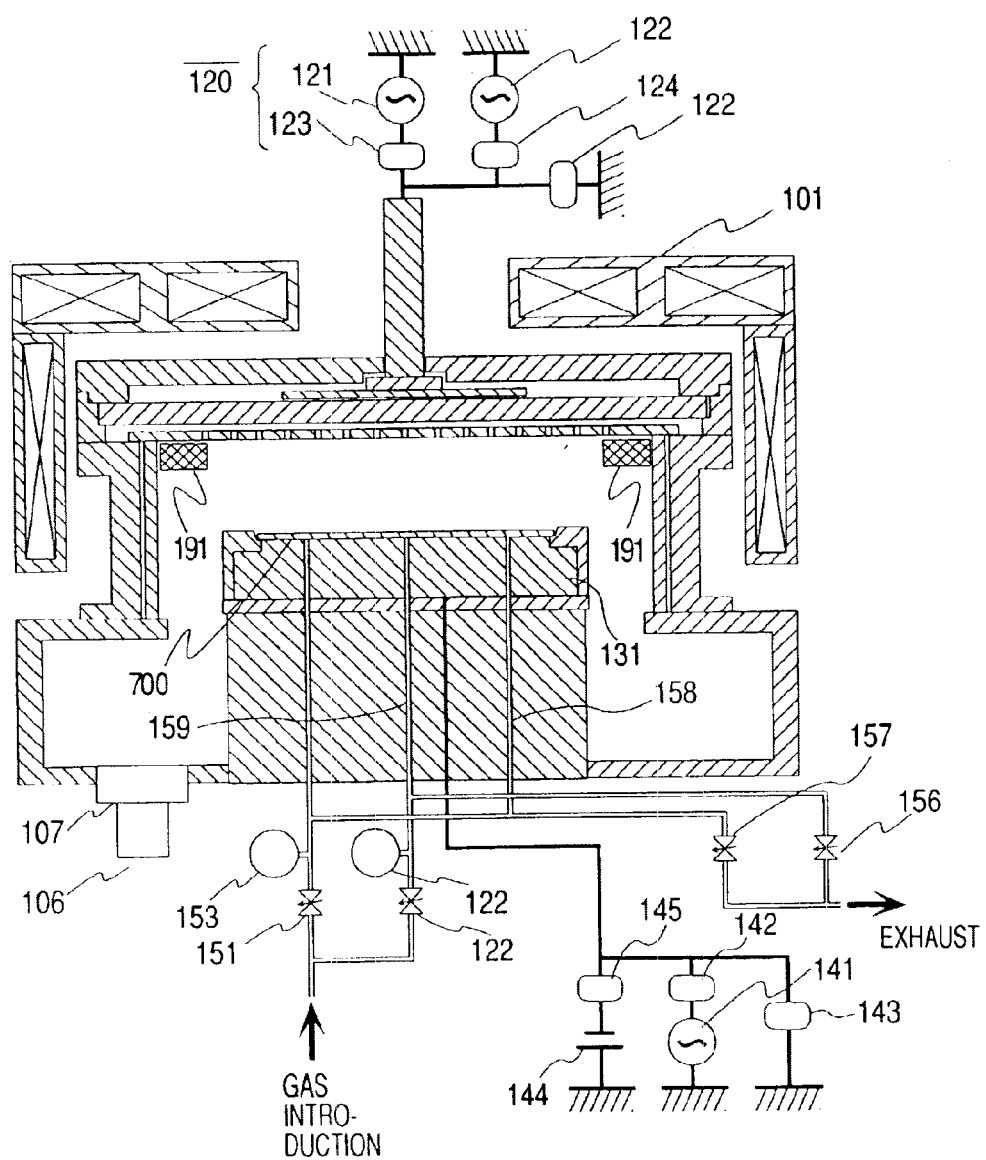
FIG. 7 is a sectional view of a plasma etching apparatus according to a third embodiment of the present invention.

FIG. 7 is a longitudinal sectional view generally showing the structure of the third embodiment of the plasma processing apparatus according to the present invention. In FIG. 7, reference numeral 191 denotes heating means for applying an amount of heat to a wafer 700 mounted on an electrostatic chuck 131. After the wafer 700 has been placed and chucked on the electrostatic chuck 131, when uniform heat is applied to the surface of the wafer 700 by the heating means 191 in the state in which the back pressure on the inner central region side of the wafer 700 is low, and the back pressure on the outer peripheral region side thereof is high, the temperature on the inner central region side of the wafer is higher than that on the outer peripheral region side. If plasma is generated under this condition, the temperature distribution continues in which the temperature on the inner central region side is higher than that on the outer peripheral region side, and, therefore, the object of the present invention is achieved.

Any means is applicable as the heating means in this case so long as the heating means can apply radiant heat to the wafer 700. In the present embodiment, an infrared lamp is used. Further, in the present embodiment, while heating by the heating means 191 is cut off when the plasma is generated, in the case where a larger temperature distribution is necessary within the surface of the wafer 700, etching also can be carried out while continuing heating with the heating means 191.

Furthermore, in the present embodiment, while the temperature distribution that is applied to the wafer 700 on the electrostatic chuck is the one actually used for the processing, a method of carrying out the process is also effective which comprises applying an in-surface temperature distribution to a separate stage in advance, placing a wafer on the stage to transfer the in-surface temperature distribution to the wafer, and then, before the temperature is not made uniform, moving the wafer to the electrostatic chuck for processing. Of course, in this case as well, a gas, such as helium, which is applied with an in-surface distribution of pressure, is filled in the gap between the electrostatic chuck and the wafer for actually carrying out the processing, whereby even after generation of a plasma, the temperature distribution should be held.

It is noted that the aforementioned embodiments 1 to 3 are mere modes for carrying out the present invention, and needless to say, the present invention is not limited to the electrostatic chuck and apparatus as described above.

According to the above-described embodiments, even in the case where the temperature of the electrostatic chuck is higher than room temperature, a suitable temperature distribution is obtained by a simple method irrespective of the presence or absence of a plasma, and, in addition, a suitable temperature distribution can be continued even during plasma processing. In accordance with the present invention, a plasma processing apparatus can be provided in which the temperature of a wafer inner central region portion is higher than that of the wafer outer peripheral portion. Thus, according to the present invention, it is possible to provide a plasma processing apparatus that is capable of processing the surface of a workpiece more precisely.

While the invention has been described with reference to its preferred embodiments, it is to be understood that the words which have been used are words of description, rather than limitation, and that changes within the purview of the appended claims may be made without departing from the true scope and spirit of the invention.

What is claimed is:

1. A plasma processing apparatus for supplying a gas between a sample and a sample table to generate a plasma for processing said sample, comprising:
   an adjusting device for adjusting the pressure of said gas supplied to a central region of said sample to a high-level at a first stage of said processing and to a low-level later in said processing.

2. A plasma processing apparatus for supplying a gas between a sample and a sample table to generate a plasma for processing said sample, comprising:
   an adjusting device for adjusting the pressure of said gas supplied to an outer peripheral region of said sample to a low-level at a first stage of said processing and to a high-level later in said processing.

3. A plasma processing apparatus for processing a wafer to be placed on a table using a plasma, wherein
   during a period in which said wafer is placed on said table, after which said plasma is formed, the heat transfer between an outer peripheral region of said wafer and the surface of said table is made smaller than the heat transfer between a central region of said wafer and the surface of said table, and after said plasma has been formed, the heat transfer between the outer peripheral region of said wafer and the surface of said table is made larger than the heat transfer between the central region of said wafer and the surface of said table.

* * * * *